(12) United States Patent
Larson et al.

(10) Patent No.: US 7,288,936 B2
(45) Date of Patent: Oct. 30, 2007

(54) RF PULSES FOR LONG T2 SUPPRESSION IN MRI

(75) Inventors: Peder E. Larson, Los Altos Hills, CA (US); John M. Pauly, Redwood City, CA (US); Steven M. Conolly, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 24 days.

(21) Appl. No.: 11/180,339

(22) Filed: Jul. 12, 2005

(65) Prior Publication Data

US 2006/0214659 A1   Sep. 28, 2006

Related U.S. Application Data

(60) Provisional application No. 60/665,981, filed on Mar. 28, 2005.

(51) Int. Cl.
*G01V 3/00* (2006.01)
(52) U.S. Cl. .................................... 324/307
(58) Field of Classification Search ........ 324/300–322; 600/410–435
See application file for complete search history.

(56) References Cited

U.S. PATENT DOCUMENTS

| | | | |
|---|---|---|---|
| 5,025,216 A | | 6/1991 | Pauly et al. |
| 5,150,053 A | * | 9/1992 | Pauly et al. ............... 324/309 |
| 5,250,898 A | * | 10/1993 | Hu et al. ................... 324/309 |
| 5,321,359 A | * | 6/1994 | Schneider ................. 324/307 |
| 5,339,035 A | * | 8/1994 | Schneider et al. ......... 324/309 |
| 5,560,360 A | * | 10/1996 | Filler et al. ............... 600/408 |
| 6,094,049 A | * | 7/2000 | Rosenfeld et al. ......... 324/307 |
| 6,307,368 B1 | * | 10/2001 | Vasanawala et al. ....... 324/309 |

OTHER PUBLICATIONS

Gurney et al., "Long-T2 Suppressed Ultra Short-TE 3DPR Imaging." In: Proceedings of the 13th Annual Meeting of ISMRM, Miami, 2005. p. 787.

(Continued)

*Primary Examiner*—Diego Gutierrez
*Assistant Examiner*—Dixomara Vargas
(74) *Attorney, Agent, or Firm*—Beyer Weaver LLP (57) ABSTRACT

In imaging a first species having a short T2 magnetic resonance parameter in the presence of a second and third species having longer T2 parameters, a method of suppressing signals from the longer T2 species comprises the steps of: a) applying a RF saturation pulse with multiple suppression bands for the second and third species to excite nuclei spins of the longer T2 species with the magnitude of the RF pulse being sufficiently low so as not to excite nuclei spins of the short T2 species, the RF saturation pulse being sufficiently long to rotate the longer T2 species nuclei spins into a transverse plane, and b) dephasing the longer T2 species nuclei spins in the transverse plane. An imaging pulse sequence is then applied to image the short T2 species. Alternatively, the method can comprise the steps of a) applying a first inversion pulse for selective inverting species of the second longer T2 species, b) obtaining first image signals after step a, c) applying a second inversion pulse for selectively inverting species of the third longer T2 species, d) obtaining second image signals after step c), and e) combining the first image signals and the second image signal to image the first short T2 species with the longer second and third species cancelling in the combination. In each of these methods, either the second or third longer T2 species can be suppressed without suppressing the other by applying the RF saturation or inversion pulse only to the species to be suppressed.

12 Claims, 14 Drawing Sheets

OTHER PUBLICATIONS

Karam et al., "Complex Chebyshev Approximation for FIR Filter Design", IEEE Transactions on Circuits and Systems—II: Analog and Digital Signal Processing, vol. 42, No. 3, Mar. 1995, pp. 207-215.

Larson et al, "Designing Long-T2 and Combination Long-T2/Fat Suppression Pulses for Ultra-Short Echo Time (UTE) Imaging" In: Proceedings of the 13th Annual Meeting of ISMRM, Miami, 2005, p. 2345.

Larson et al., "Using Adiabatic Inversion Pulses to Suppress Long-T2 Species in Ultra-Short Echo Time (UTE) Imaging." In: Proceedings of the 13th Annual Meeting of ISMRM, Miami, 2005, p. 786.

Pauly et al., "Parameter Relations for Shinnar-Le Roux Selective Excitation Pulse Design Algorithm", IEEE Transactions on Medical Imaging, vol. 10, No. 1, Mar. 1991, pp. 53-65.

* cited by examiner

RF PULSES FOR LONG T2 SUPPRESSION IN MRI

CROSS REFERENCE TO RELATED APPLICATIONS

This application claims benefit under 35 USC 119 to U.S: Provisional Patent Application No. 60/665,981, filed Mar. 28, 2005, entitled "USING ADIABATIC PULSES FOR LONG-$T_2$ SUPPRESSION" which is incorporated herein for all purposes.

GOVERNMENT RIGHTS

The U.S. government has rights in the disclosed invention pursuant to NIH grant to Stanford University, Grant No.: R01 EB002524.

BACKGROUND OF THE INVENTION

This invention relates generally to magnetic resonance imaging (MRI), and more particularly the invention relates to imaging short T2 species while suppressing longer T2 species.

The imaging of short T2 species, such as brain and tendon tissue for example, is difficult in the presence of longer T2 species such as water and fat.

The present invention is directed to providing RF pulses and the use of the pulses which can suppress longer T2 species and allow the imaging or shorter T2 species.

SUMMARY OF THE INVENTION

In accordance with the invention, RF pulses are provided which selectively invert or saturate nuclei spins based on length of the T2 parameter of the spins.

In one embodiment, longer T2 spins can be saturated while shorter T2 spins have less or no saturation. The saturated spins can be dephased, and then the shorter T2 spins can be excited and imaged with minimal interference from the longer T2 spins.

In another embodiment, a non-inverted image can be summed with an inverted image. Long T2 spins will have opposite signs in the two images and will cancel out. Alternatively, two selectively inverted images can be subtracted to eliminate the inverted larger T2 spins. If different inversion pulses are used, different T2 contrast can be realized and an image can be created that has a range of short T2 components with a maximum signal.

In another embodiment, a $2\pi$ pulse can be used for the non-inverted images. Combining an inverted image with a $2\pi$ prepared image will cancel long T2 signals and eliminate any residual signal that might remain if a non-inverted signal were used.

In another embodiment, a RF pulse can have multiple suppression bands whereby two species such as water and fat can be eliminated. For water and fat suppression, one suppression band is at the water resonance and one suppression band is at the lipid (fat) resonance.

In all embodiments, the amplitude of the RF pulse is kept sufficiently low to avoid exciting shorter T2 species and is sufficiently long to fully invert or saturate longer T2 species.

The invention and objects and features thereof will be more readily apparent from the following detailed description and appended claims when taken with the drawings.

BRIEF DESCRIPTION OF THE DRAWINGS

FIGS. 15 (a)-15(e) are images of cortical bone with (a) no suppression, (b) water suppression, (c) fat suppression, (d) fat and water suppression, and (e) fat and water suppression with increased amplitude of the inversion (saturation) RF excitation pulse.

DETAILED DESCRIPTION

The invention provides RF pulses that selectively invert or saturate longer T2 species without fully saturating shorter T2 species. The inversion pulses must have low amplitude and bandwidth so as not to invert shorter T2 species but with sufficient amplitude and duration to invert longer T2 species.

In one embodiment, adiabatic RF pulses are used to selectively invert longer T2 species without fully inverting shorter T2 species. Using adiabatic pulses offers the advantage of being extremely robust to any variations in RF amplitude. These variations are especially prevalent in surface coil excitation and can also be 20-30% in common head coils. All previous RF-based suppression methods are not robust to these variations and will suffer under adverse conditions.

To use these pulses for long-T2 suppression we propose a few methods. One method is to create a single image prepared with the inversion pulse and separate based on voxel phase. Longer T2s will be inverted and have opposite phase to short T2s. Since a minimum echo time is used there is little time for phase accrual that would interfere with the separation. Partial volume effects can be a problem with this method.

Another method is to sum a non-inverted image with an inverted image. Long-T2s will have opposite signs in each and will cancel out. Short-T2s will have the same sign and will become bright. One variation on this method is to sum an water-inverted image and a fat-inverted image. This has the advantage of canceling out fat in addition to long-T2s. Another variation is to subtract two inverted images. If different inversion pulses are used, they have different types of T2 contrast and create an image that has a range of short-T2s with maximum signal.

In a phase contrast method, an inversion preparation pulse is applied to invert longer T2 spins but not shorter T2 spins, and an image signal is obtained. The acquired image is separated into two images based on opposing phases of the short T2 spin signal and the inverted longer T2 spin signals.

In a fat long-T2 and water long-T2 suppression method, a first image is obtained after inverting longer T2 spins at the water resonance. Then, a second image is obtained after inverting longer T2 spins at the lipid (fat) resonance. The two images are combined which suppresses the longer T2 signals from water and fat while the short T2 signals add.

One variant of some of these methods would be to use an adiabatic $2\pi$ pulse for the non-inverted images. Since there is some T2 decay during the inversion pulse, even long-T2s are not fully inverted. During a $2\pi$ pulse the same decay will occur. Thus combining an inverted image and a $2\pi$ prepared image will exactly cancel out the long-T2s where some residual signal may have remained if a non-inverted image was used. Medium-T2s, which also have residual signal if a non-inverted image is used, will cancel out in this variation. The downside is that this method is slightly less SNR efficient because most short-T2 signal is destroyed in the $2\pi$ prepared image.

Figure 3:
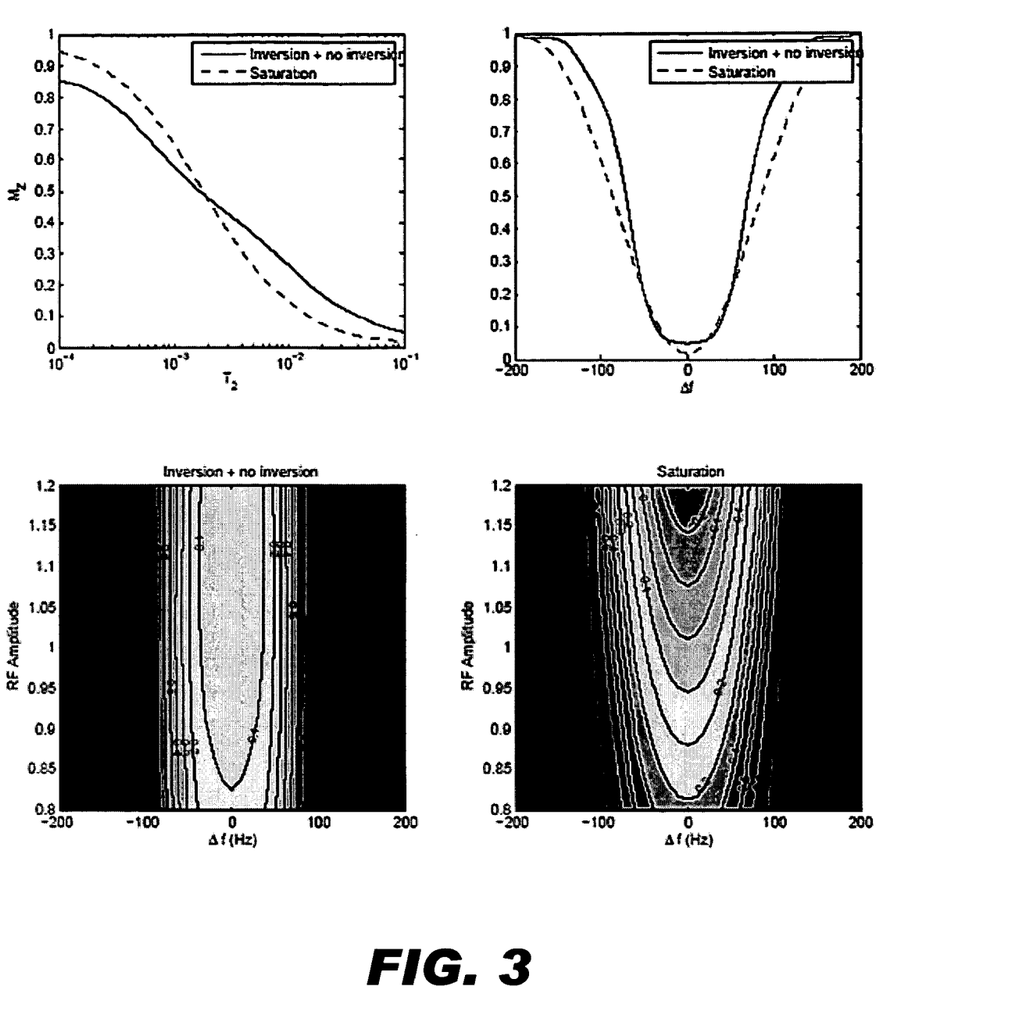
FIG. 3 illustrates a comparison of T2 profile, off-resonance profile, and B1 sensitivity of a rectangular long T2 suppression pulse and combining a non-inverted and adiabatic pulse inverted image.

We can compare the method of summing a non-inverted and inverted image to rectangular long-T2 suppression pulses. We can design both such that they have the same T2 suppression. For this example, both have a factor of 10 suppression for T2 species longer than 50 ms, and a signal loss of 50% for T2=2 ms. The rectangular RF pulse method has a B0 bandwidth of ±32 Hz and a tolerance for ±6% B1 variations. Our method has a B0 bandwidth of ±36 Hz and a tolerance for ±20% B1 variations. For similar T2 profiles and B0 bandwidths, there is a factor of almost 4 improvement in B1 robustness over the previous method. FIG. 3 shows the T2 profiles as well as the B0 and B1 sensitivities for this case.

The only disadvantage is that the inversion pulses used are longer than the rectangular pulses, restricting the minimum TR. In the example above, a 20 ms adiabatic pulse and a 5 ms rectangular pulse were used. This is not a problem with long TRs common in UTE imaging (≈500 ms). Some of the proposed methods also require two images but both have signal from short-T2s. Other image combination techniques use later echo time images which have no signal from short-T2s, making our methods more SNR efficient.

When amplitude-modulated pulses have a long duration and low amplitude, short-T2 species are unaffected by the pulse. Similarly, adiabatic pulses of sufficiently low amplitude and narrow bandwidth will not excite short-T2 species. To minimize short-T2 attenuation, a near minimum amplitude should be used. This requires a long duration to maintain adiabaticity for long-T2 species.

Experiments were performed on a GE Excite 1.5T system. Inverted images were acquired by using an inversion pulse followed immediately by a dephaser and then a half-pulse excitation.

Figure 4:
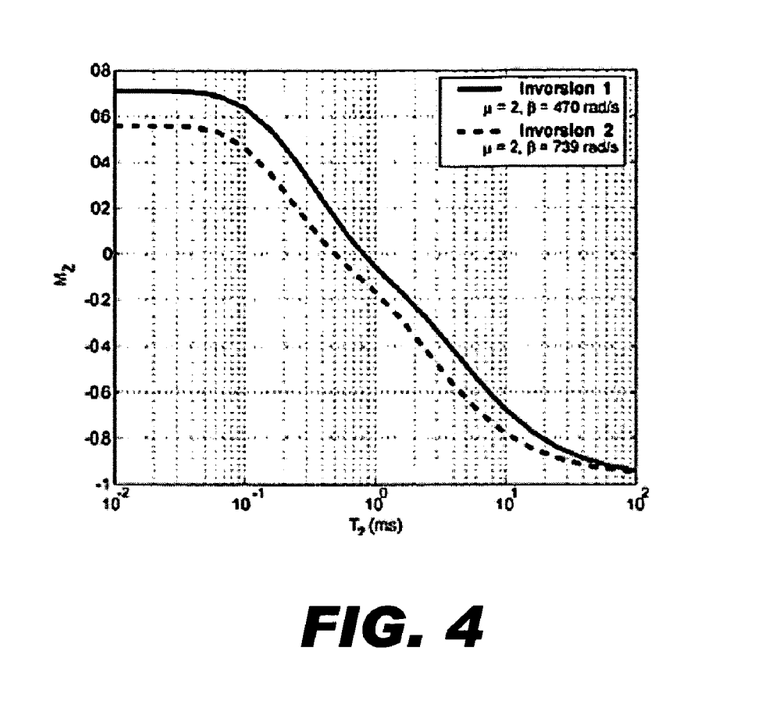
FIG. 4 is a plot of remaining longitudinal magnetization versus T2 after 10 ms adiabatic sech inversion pulses.
Figure 5:
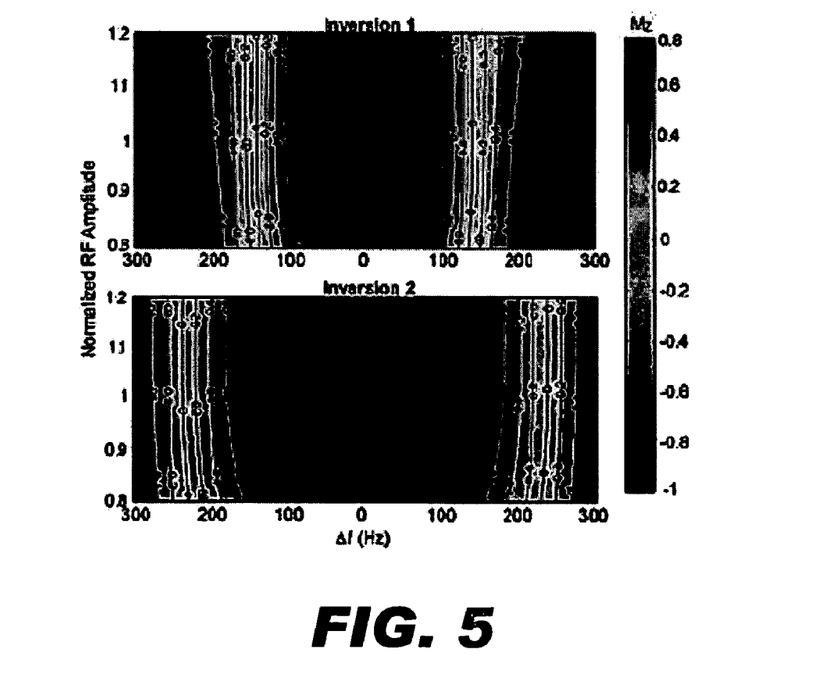
FIG. 5 illustrates contour plots of MZ versus off-resonance and RF variation of T2=100 ms.

FIG. 4 shows the T2 profile of two 10 ms adiabatic sech inversion pulses with parameters shown. T2s of a few hundred μs are not inverted, while T2s near 100 ms are fully inverted. There is more short-T2 attenuation during Inversion 2 because it has a wider bandwidth requiring a larger amplitude. The FIG. 5 contour plots of MZ show that RF amplitude variations of ±20% are tolerated by both inversion pulses, which is not true for amplitude modulated pulses. The wider bandwidth of Inversion 2 is shown.

FIG. 6 shows phantom images using the Inversion 1 pulse. FIG. 6a is the non-inverted image and FIG. 6b is the inverted image. The short-T2 phantom (0.35 ms) is unaffected by the pulse, the medium-T2 phantoms (4 and 6 ms) have been nulled, and the long-T2 phantoms (50 and 100 ms) are inverted. When the non-inverted and inverted images are combined, FIG. 6c, the long-T2 phantoms are suppressed. The inverted image is also separated by phase into short (6d) and long (6e) T2 images.

Figure 6A:
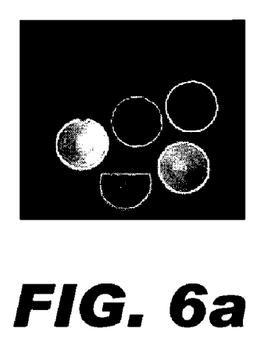
FIGS. 6(a)-6(e) are images of a phantom using ultra-short echo time (UTE) imaging. The T2 values, in ms, of the phantoms are (top row, left to right) 4, 100, 50, (bottom row) 0.35, 20.
Figure 6B:
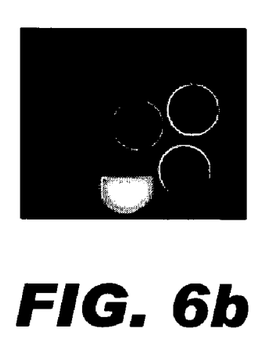
Figure 6C:
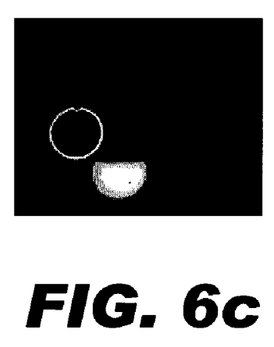
Figure 6D:
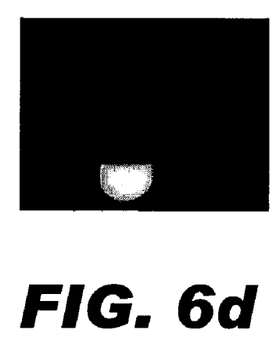
Figure 6E:
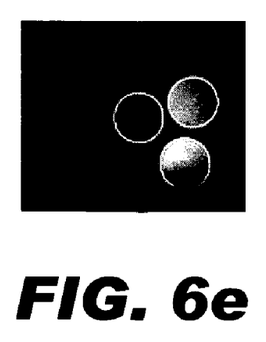

There are multiple possible techniques to remove long-T2s using adiabatic inverted images. The images can be separated based on their phase to produce short and long T2 images, as shown in FIG. 6d,e. Combining an inverted and non-inverted image will suppress long-T2s, as shown in FIG. 6c. Inverted water and inverted fat images can be combined for long-T2 and fat suppression. These combination techniques are SNR efficient because both images have short-T2 signal. Image subtraction using a later echo only contributes noise to short-T2s.

Figure 1:
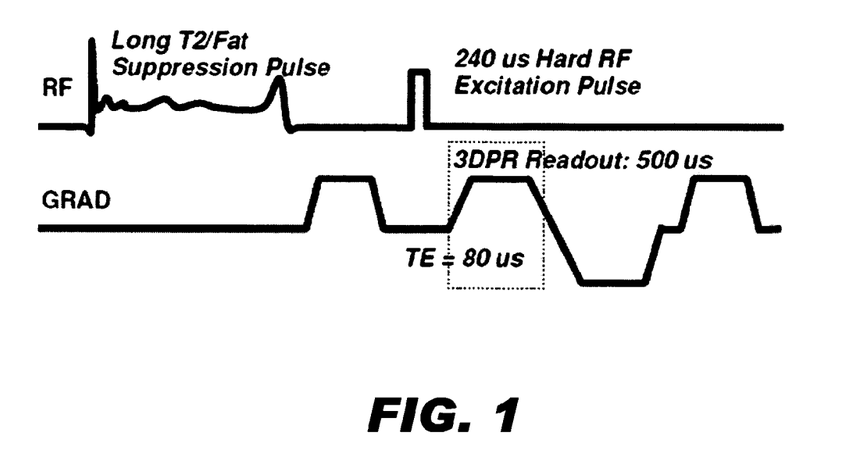
FIG. 1 is a pulse sequence including a RF signal for suppressing longer T2 species in accordance with an embodiment of the invention.

FIG. 1 illustrates a pulse sequence including a long T2 suppression pulse for use in 3D ultra short T2 imaging. Here a 20 ms RF pulse is played out which rotates long T2 species and fat spins into the transverse plane. These spins are then dephased using a crusher pulse. A 240 us 45 degree hard RF pulse excitation is then played out which excites the remaining short T2 species. These spins are imaged using a 3DPR sequence with as short a TE as possible (80 us). Sampling occurs on the ramp of the PR spoke. Using the high-speed gradients of the GE Excite 1.5T scanner (150 mT/m/ms) and high bandwidth acquisition (+/−250 kHz) allows a 1 mm isotropic resolution to be obtained using a readout length of less than 500 us. Therefore, full 1 mm isotropic resolution will be obtained for spins with T2s on the order of 500 us.

Figure 2A:
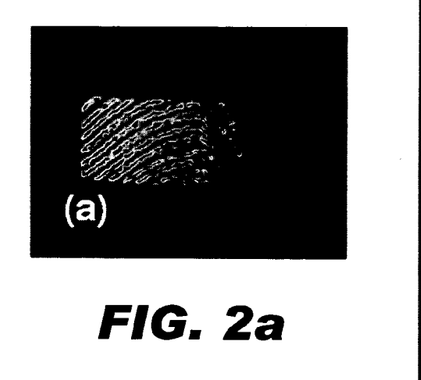
FIGS. 2(a), 2(b) are images of short T2 species obtained with the pulse sequence of FIG. 1.
Figure 2B:
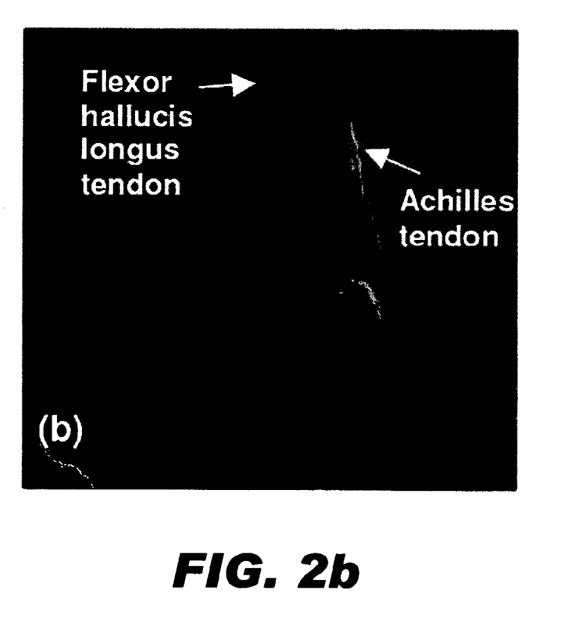

This pulse sequence was implemented and used to scan a number of short T2 species. FIG. 2(a) shows a scan of a solid block of wood, in which the age lines and a knot are clearly distinguishable. FIG. 2(b) shows the Achilles tendon of a volunteer. 8192 3DPR spokes were acquired at a TR of 150 ms (scan time of 20 minutes). A multi-planar reformat through the 3D data set (FIG. 2) showed good long-T2 fat suppression—the ultra short T2 species appeared to be very bright compared to the surrounding tissue. In order to obtain a reasonable scan time, the 3DPR was undersampled by a factor of about 3 which leads to some streaking artifacts.

In accordance with an embodiment of the invention, a RF pulse can have multiple suppression bands. To create a long-T2 water and fat suppression pulse, we used multiple suppression bands—one for long-T2s at the water resonance and one for long-T2s at the lipid (fat) resonance. Adding a long-T2 fat suppression band increases the overall short-T2 attenuation slightly.

The set of novel pulses we have designed has spectrally selective suppression bands at the lipid and water resonances with minimal effects on the short-T2 magnetization. They are maximum phase to assist with dephasing the saturated magnetization. This pulse will suppress long-T2 components in water and fat, leaving only short-T2s with longitudinal magnetization.

Design of these pulses was done using the Shinnar-LeRoux (SLR) pulse design algorithm. The pulses have suppression bands on the water and lipid resonances. The bandwidth of these bands can be adjusted depending on the expected B0 variation and quality of shim of a given application, keeping in mind that a minimal bandwidth should be used to minimize short-T2 attenuation. They are also designed with maximum phase to assist with the dephasing of the saturated magnetization.

These pulses are designed for use with UTE imaging. They are applied immediately before the excitation and imaging sequences. A crusher gradient is used following the pulse to dephase the long-T2 components that are in the transverse plane. This leaves only short-T2 components with longitudinal magnetization, and thus they are the only components imaged.

In theory, we solved the Bloch equation for $M_Z$ at conclusion of a RF pulse, $\omega_1(t)$. We included T2 decay but not T1 decay and assumed T2 is much shorter than the pulse duration to obtain the following result:

$$M_Z(T_2) \cong 1 - T_2 \int_0^T |\omega_1(t)|^2 dt = 1 - T_2 \int_{-\infty}^{\infty} |\Omega_1(f)|^2 df \quad (1)$$

This result shows that short-T2 attenuation is proportional to the integrated squared spectrum of an RF pulse.

Figure 7:
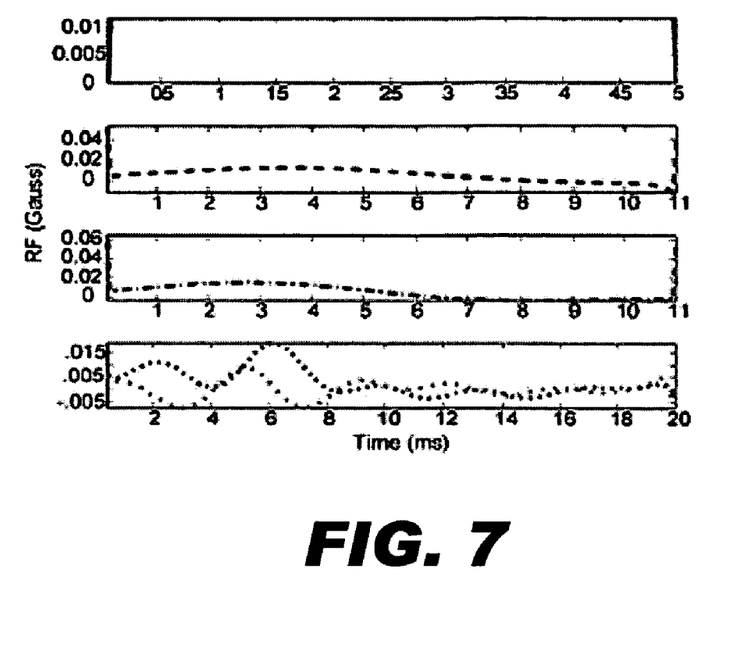
FIG. 7 is plots of four long T2 suppression pulses.

The SLR pulse design algorithm is useful for designing long-T2 suppression pulses because it allows us to put most of the pulse energy in the suppression band. Equation (1) tells us that this limits short-T2 attenuation while maximizing bandwidth. The algorithm also creates the minimum power RF pulse for a given profile. The pulses are maximum phase to assist the suppression and shrink the transition widths. We also used the complex Parks-McClellan algorithm to design dual band pulses with fat and water long-T2 suppression. The RF pulses used are shown in FIG. 7 with different time scales. Analysis was done using a full Bloch equation simulation and experiments were done on a GE Excite 1.5T scanner.

Figure 8A:
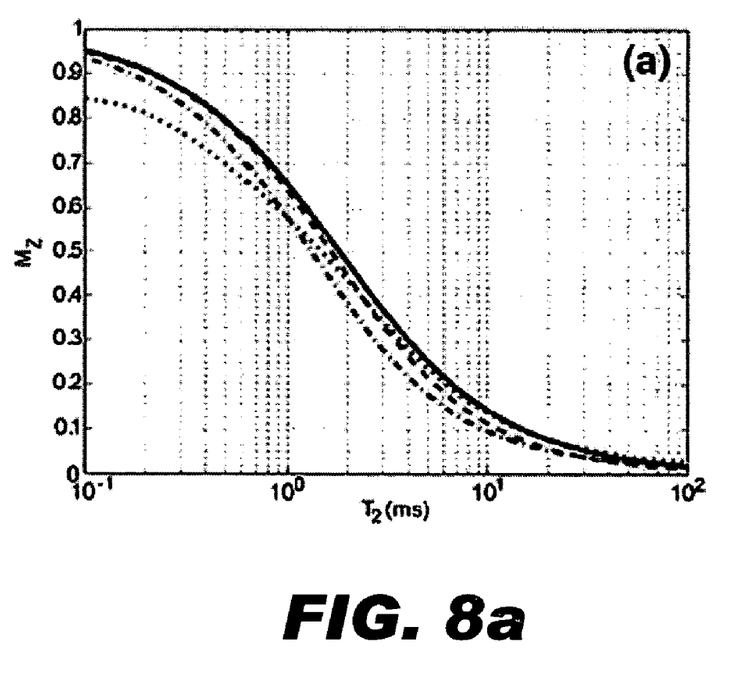
FIG. 8(a) illustrates T2 profiles for the four pulses of FIG. 7.
Figure 8B:
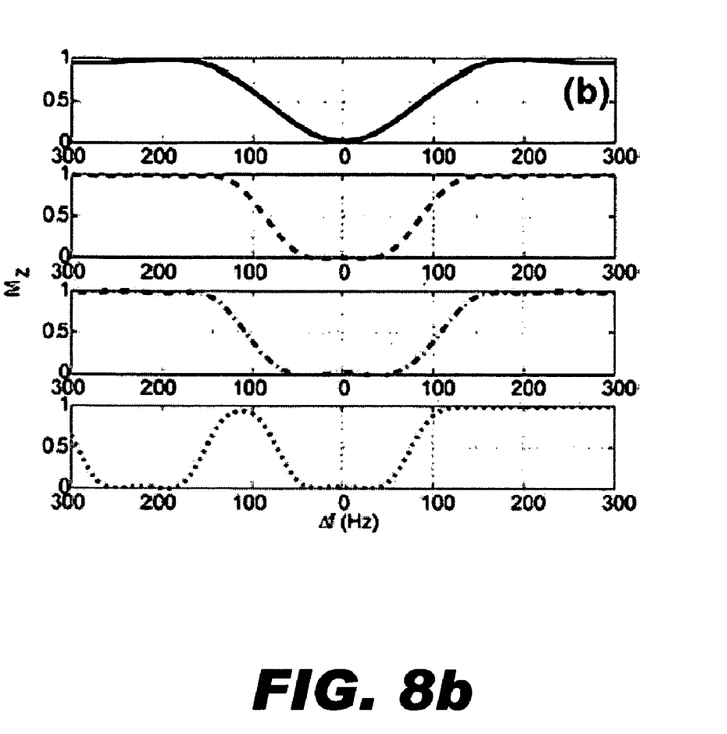
FIG. 8(b) illustrates off-resonance profiles at 1.5T with T2=100 ms.

FIG. 8 shows the simulated spectral and T2 profiles of the four long-T2 suppression pulses from FIG. 1. The 11 ms time-bandwidth (TBW) 2.0 SLR pulse and the 5 ms hard pulse have identical T2 profiles, but the SLR pulse has a flatter and wider suppression band. The 11 ms TBW 2.4 SLR pulse has a wider bandwidth than both so the short-T2s are more attenuated. The 20 ms dual band suppression pulse includes a spectral band to saturate fat. This additionally attenuates the Mz of short-T2s an amount proportional to the width of the extra suppression band.

Figure 9A:
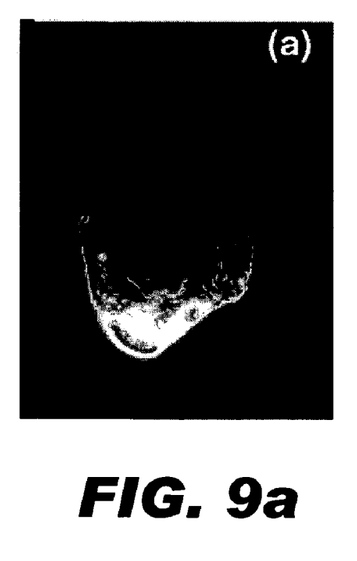
FIGS. 9(a), 9(b) are images with no T2 suppression and with T2 suppression.
Figure 9B:
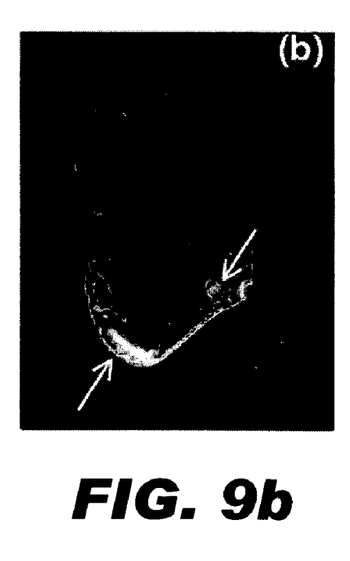

FIG. 9 shows in vivo UTE images of the left ankle with (b) and without (a) suppression pulses. A 5" surface coil was used with TE=80 μs, TR=500 ms, 5 mm slice thickness, and 3:12 per image. The tendons (arrows) are not obscured by other tissues when the long-T2/fat suppression pulse was used.

Figure 10:
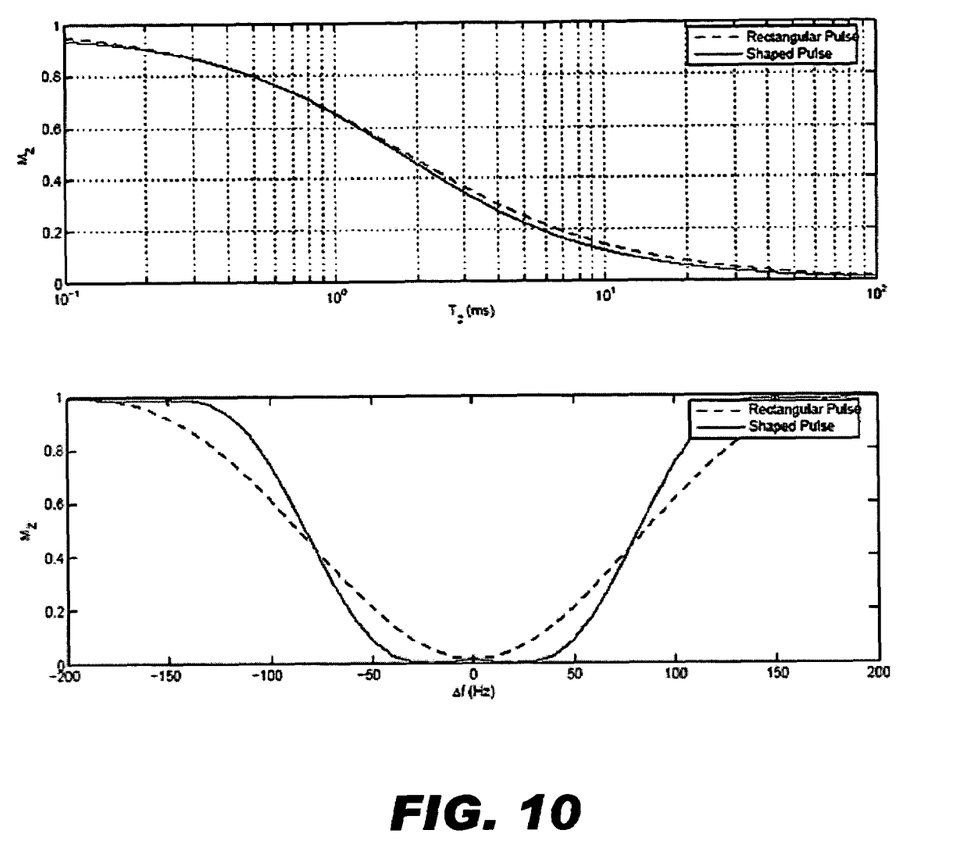
FIG. 10 is graphs of magnetization versus T2 and comparing a rectangular long T2 suppression pulse and a long T2 suppression pulse in accordance with the invention.

We can demonstrate how our long-T2 water suppression pulses are an improvement over previous rectangular pulses. For comparison, both pulses will have a factor of 20 suppression for T2 species longer than 30 ms, and a signal loss of 50% for T2=2 ms. The rectangular pulse has a factor of 20 suppression bandwidth of ±20 Hz, while our pulses have a bandwidth of ±44 Hz. This is over a factor of 2 improvement in B0 bandwidth. FIG. 10 shows the T2 and B0 profiles for the two pulses.

Figure 11:
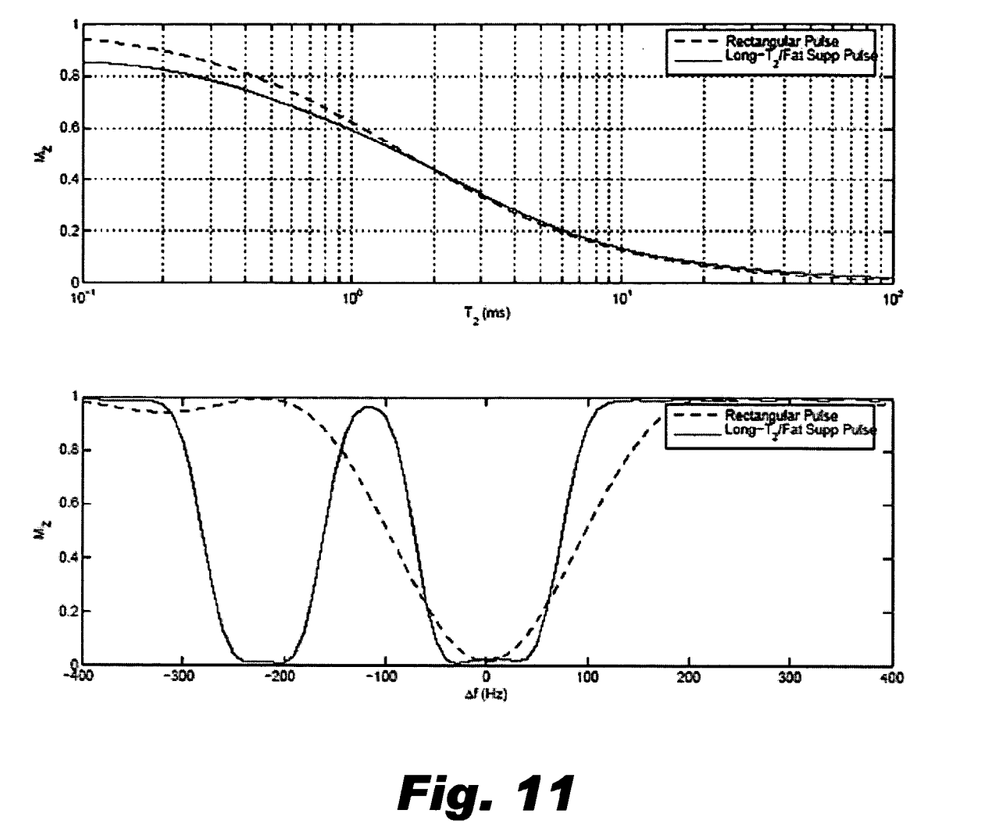
FIG. 11 is a comparison of T2 profile and off resonance profile of a rectangular long T2 suppression pulse and a pulse with both fat and water suppression.
Figure 12A:
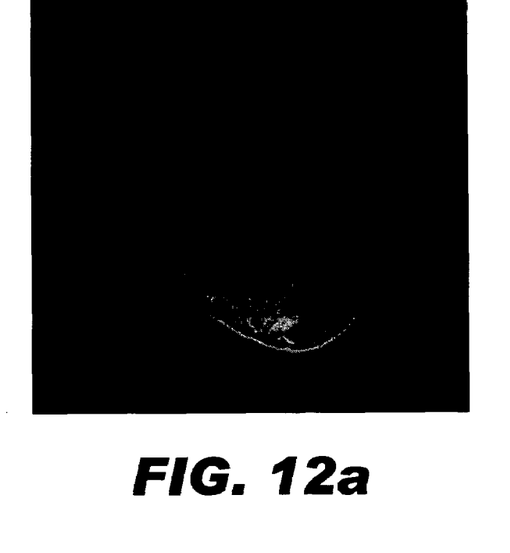
FIGS. 12(a), 12(b) are axial ankle images with no suppression and with fat and water suppression for imaging tendons.
Figure 12B:
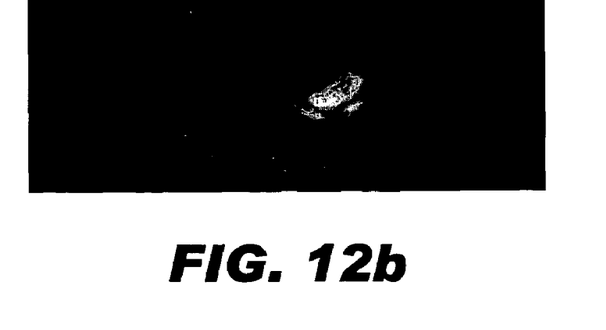
Figure 13A:
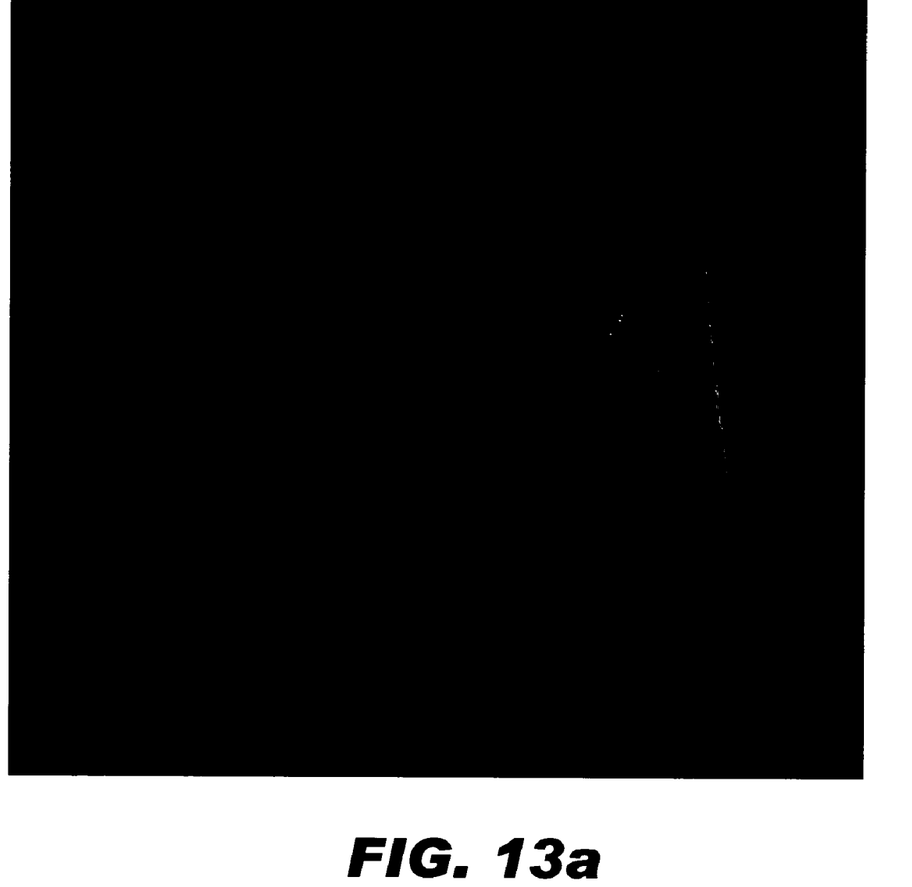
FIGS. 13(a), 13(b) are sagittal ankle images with no suppression and with fat and water long-T2 suppression for imaging tendons.
Figure 13B:
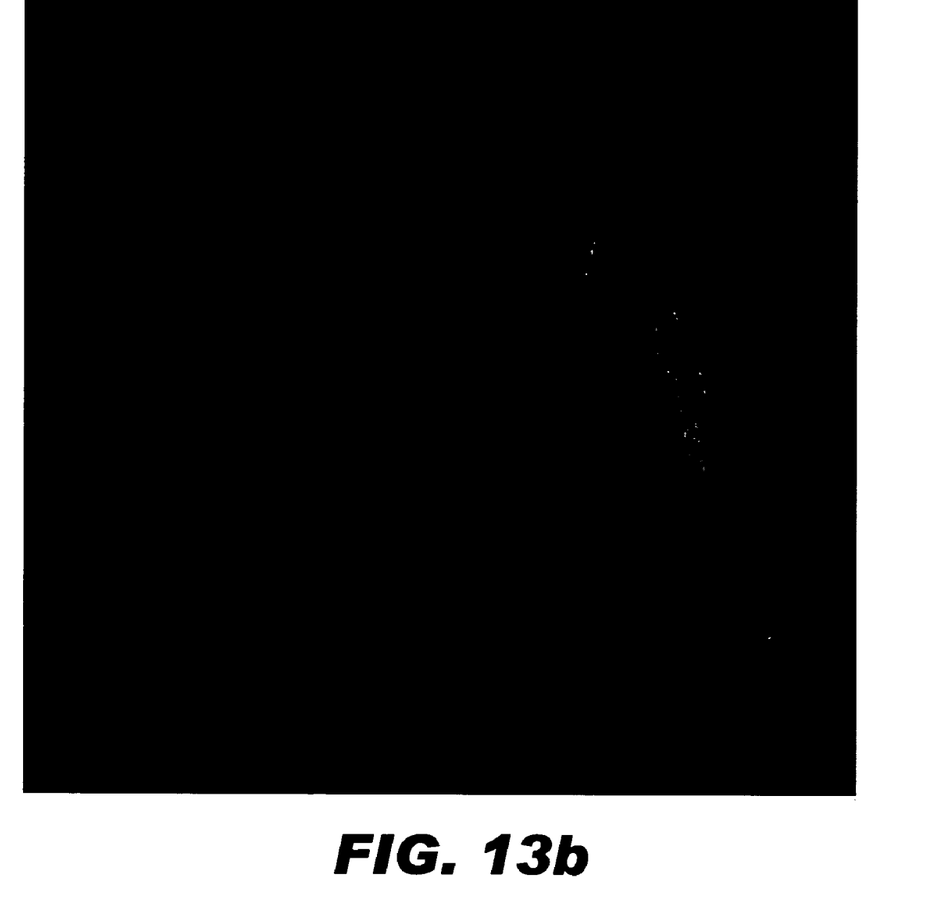
Figure 14A:
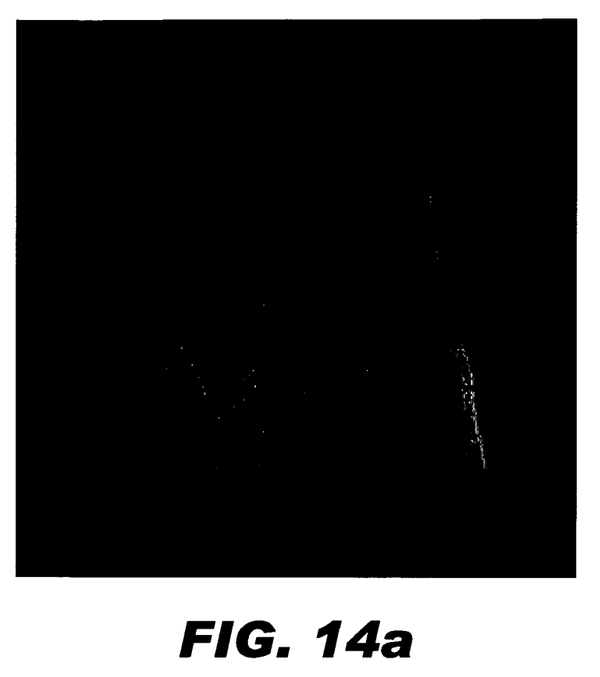
FIGS. 14(a), 14(b) are sagittal knee images with no suppression and with fat and water long-T2 suppression for imaging tendons.
Figure 14B:
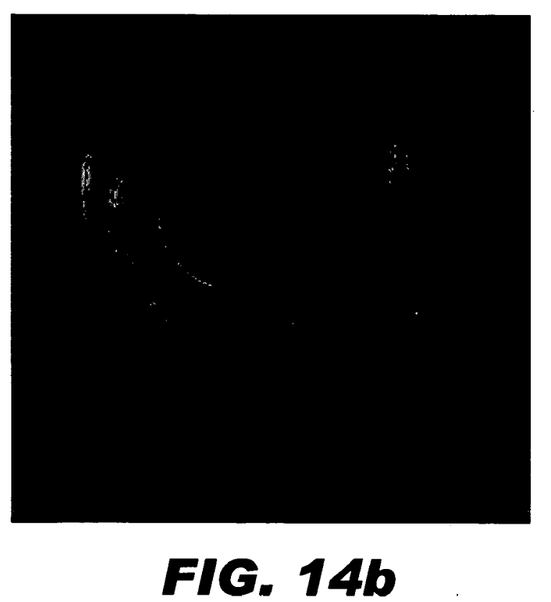

We can also compare our long-T2 water and fat suppression pulses to rectangular long-T2 suppression pulses. We can design both such that they have the same T2 suppression. For this example, both have a factor of 20 suppression for T2 species longer than 30 ms, and a signal loss of 50% for T2=1.6 ms. The rectangular RF pulse has a factor of 20 suppression B0 bandwidth of ±23 Hz. Our pulse has a factor of 20 suppression B0 bandwidth of +44 Hz at the water resonance and an additional ±31 Hz of bandwidth at the fat resonance. FIG. 11 shows the T2 and B0 profiles of the pulses. Our new pulse shows an improvement by nearly a factor of 2 in B0 bandwidth at water and will also suppress fat.

FIGS. 12-15 are images further illustrating improved imaging of tendons and bone using the invention. FIGS. 12(a), 12(b) are axial ankle images with no suppression and with fat and water suppression for imaging tendons. FIGS. 13(a), 13(b) are sagittal ankle images with no suppression and with fat and water long-T2 suppression for imaging tendons. FIGS. 14(a), 14(b) are sagittal knee images with no suppression and with fat and water long-T2 suppression for imaging tendons. FIGS. 15(a)-15(e) are images of cortical bone with (a) no suppression, (b) water inversion, (c) fat inversion, (d) fat and water suppression, and (e) fat and water suppression with increased amplitude of the RF inversion (saturation) excitation pulse. These images are in vivo results imaging the cortical bone (T2 =0.5 ms) in the Tibia. They were acquired using a 2D UTE sequence with TE =80 us, TR =300 ms, 2:40 time per image, 3" receive-only surface coil, 12 cm FOV, 5 mm slice thickness, and 1 mm in-plane resolution. A fat-inverted image (c) and a water-inverted image (b) were acquired using adiabatic pulses to suppress both fat and water long-T2s.

Figure 15A:
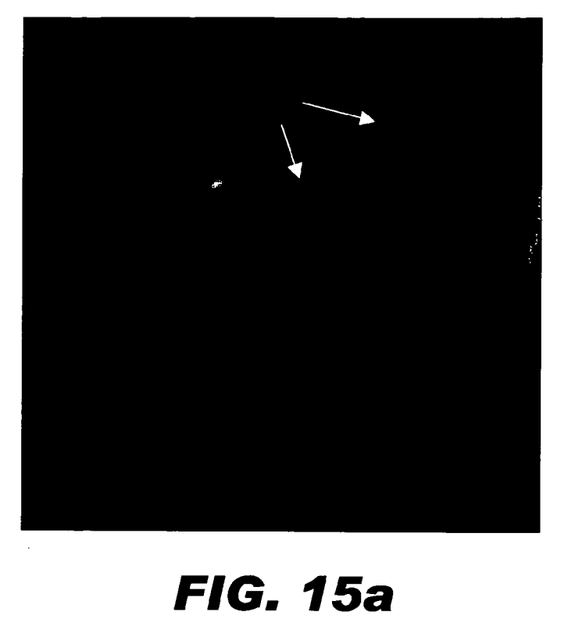
Figure 15B:
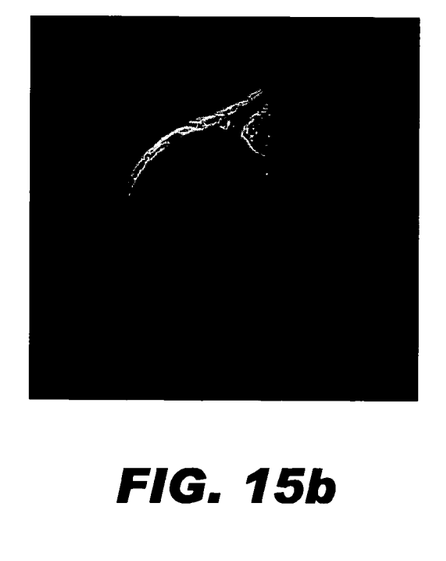
Figure 15C:
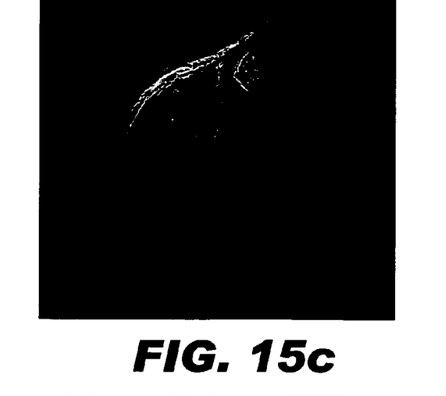
Figure 15D:
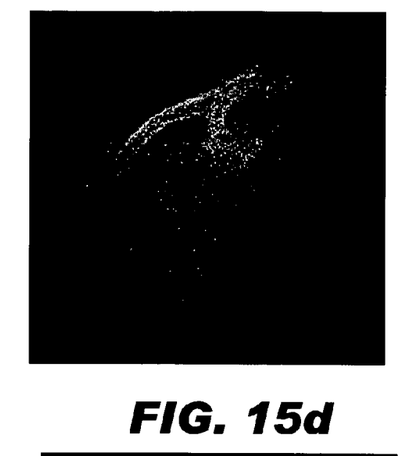
Figure 15E:
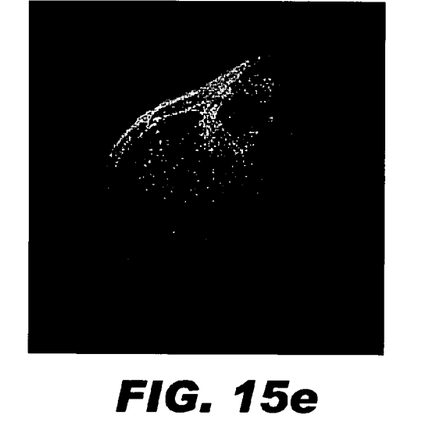

When the fat-inverted and water-inverted images are combined (d), only the signal from the cortical bone and other short-T2s remain bright. Without suppression (a), the cortical bone has signal, but is difficult to distinguish from surrounding muscle and fat in the bone marrow. When the amplitude of the adiabatic pulse is increased by 15%, the suppression does not suffer at all (e).

The only disadvantage is that our pulses are longer than the rectangular pulse, restricting the minimum TR. This is generally not a problem with long TRs common in UTE imaging (≈500 ms).

The novel pulses we have designed suppresses long-T2 species at both the fat and water resonance. This differs from previous long-T2 suppression pulses which just suppressed long-T2s at the water resonance. As noted above, long-T2 water and fat suppression are both essential for many UTE imaging applications. Using one pulse to accomplish both is a simple and new technique that will create better UTE images.

The new long-T2 water suppression pulses we have designed are also an improvement over previous long-T2 suppression pulses. Previously, only rectangular RF pulses and variations had been used. Our pulses are shaped and designed using the SLR algorithm, a technique that had never been previously applied to long-T2 suppression pulses.

The pulses shown are designed for 1.5 T systems and reasonable expected B0 variations. These pulses could also be designed for other magnet strength systems and also with different bandwidths, as the application requires. The lipid and water bandwidths can be adjusted.

There may be other applications beyond UTE imaging where it is desired to suppress water and lipid resonances. Our pulses can provide very selective suppression, inversion, or excitation of just these two important tissue resonances. They are designed to use a minimal amount of RF power to minimize short-T2 attenuation.

The invention has been described with reference to specific embodiments. However, the description is illustrative of the invention and is not to be construed as limiting the invention. Various modifications and applications may occur to those skilled in the art without departing from the true spirit and scope of the invention as defined by the appended claims.

What is claimed is:

1. In imaging a first species having a short T2 magnetic resonance parameter in the presence of a second and third species having longer T2 parameters, a method of suppressing signals from the longer T2 species comprising the steps of:
    a) applying a RF excitation pulse with multiple suppression bands for the second and third species to excite nuclei spins of the longer T2 species with the magnitude of the RF pulse being sufficiently low so as not to excite nuclei spins of the short T2 species, the RF excitation pulse being sufficiently long to rotate the longer T2 species nuclei spins into a transverse plane,
    b) dephasing the longer T2 species nuclei spins in the transverse plane,
    c) applying an imaging pulse sequence to image the short T2 species, and
    d) generating an image of the first species without the dephased longer T2 species nuclei spins in the transverse plane.

2. The method of claim 1 wherein step b) includes applying a dephasing magnetic gradient to the longer T2 nuclei spins.

3. The method of claim 1 wherein the first species is tissue, the second species is water, and the third species is fat, the RF excitation pulse including a first suppression band at the resonance of water, and a second suppression band at the resonance of fat.

4. The method of claim 1 further comprising applying an inversion pulse to selectively invert the longer T2 species and not invert the short T2 species.

5. A method of magnetic resonance imaging short T2 species in an object including longer T2 species comprising the steps of:
    a) obtaining first image signals from the body,
    b) applying an inversion pulse to selectively invert the longer T2 species and not invert the short T2 species,
    c) obtaining second image signals after step b),
    d) combining the first image signals and the second image signals whereby signals from longer T2 species tend to cancel, and
    e) forming a magnetic resonance image from the combined first image signals and second image signals.

6. The method of claim 5 wherein in step b) the inversion pulse amplitude is sufficiently low as not to invert the short T2 species.

7. The method of claim 6 wherein the inversion pulse is adiabatic.

8. The method of claim 6 wherein the RF pulse is a sech pulse.

9. The method of claim 6 wherein in step a) a 2 pi pulse is applied before obtaining the first image signals.

10. A method of magnetic resonance imaging first short T2 species in an object including second longer T2 species and third longer T2 species comprising the steps of:
    a) applying a first inversion pulse for selective inverting species of the second longer T2 species,
    b) obtaining first image signals after step a,
    c) applying a second inversion pulse for selectively inverting species of the third longer T2 species,
    d) obtaining second image signals after step c),
    e) combining the first image signals and the second image signal to image the first short T2 species with the longer second and third species cancelling in the combination; and
    f) generating an image of the first short T2 species.

11. The method of claim 10 wherein the first inversion pulse has an inversion band at the resonance frequency of the second species, and the second inversion pulse has an inversion band at the first resonance frequency of the third species.

12. The method of claim 10 wherein the first species is tissue, the second species is water, and the third species is fat, the first inversion pulse including an inversion band at the resonance of water, and the second inversion pulse including an inversion band at the resonance of fat.

* * * * *